(12) United States Patent
Vinter

(10) Patent No.: US 9,860,639 B2
(45) Date of Patent: Jan. 2, 2018

(54) DYNAMIC BACK-BIASING IN FD-SOI PROCESS FOR OPTIMIZING PSU RATIO

(71) Applicant: GN HEARING A/S, Ballerup (DK)

(72) Inventor: Martin Vinter, Kgs. Lyngby (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 15/052,462

(22) Filed: Feb. 24, 2016

(65) Prior Publication Data

US 2017/0188144 A1    Jun. 29, 2017

(30) Foreign Application Priority Data

Dec. 29, 2015 (EP) .................................. 15202902

(51) Int. Cl.
| | |
|---|---|
| H04R 3/00 | (2006.01) |
| H03K 3/03 | (2006.01) |
| H04R 25/00 | (2006.01) |
| G05F 3/20 | (2006.01) |

(52) U.S. Cl.
CPC ............ *H04R 3/007* (2013.01); *G05F 3/205* (2013.01); *H03K 3/0315* (2013.01); *H04R 25/305* (2013.01); *H04R 25/505* (2013.01)

(58) Field of Classification Search
CPC .. H04R 25/00; H04R 25/602; H04R 2225/31; H04R 2225/33
USPC ................................................. 381/312, 323
See application file for complete search history.

(56) References Cited

U.S. PATENT DOCUMENTS

| | | | |
|---|---|---|---|
| 6,466,077 B1 | 10/2002 | Miyazaki et al. | |
| 7,245,177 B2* | 7/2007 | Fujita ...................... | G05F 3/205 |
| | | | 327/534 |
| 2007/0002640 A1 | 1/2007 | Byeon | |
| 2009/0167425 A1 | 7/2009 | Park | |
| 2011/0095811 A1* | 4/2011 | Chi ......................... | G05F 3/205 |
| | | | 327/512 |
| 2011/0211717 A1 | 9/2011 | Hoevesteen | |

OTHER PUBLICATIONS

Srivastava, Ashok, et al., "An Adaptive Body-Bias Generator for Low Voltage CMOS VLSI Circuits", International Journal of Distributed Sensor Networks, 4: p. 213-222, 2008, 11 pages.
Extended European Search Report dated Jun. 9, 2016 for corresponding EP Patent Application No. 15202902.1, 10 pages.
European Communication pursuant to Article 94(3) EPC dated Jun. 27, 2017 for corresponding EP Patent Application No. 15202902.1, 7 pages.

* cited by examiner

*Primary Examiner* — Suhan Ni
(74) *Attorney, Agent, or Firm* — Vista IP Law Group, LLP

(57) ABSTRACT

A power control circuit for a hearing device is devised. The power control circuit has a switched-capacitor power supply, a substrate bias control circuit, a reference circuit, a performance monitor circuit, a first plurality of N-type semiconductors and a second plurality of P-type semiconductors. The performance monitor circuit is adapted to monitor the supply voltage, the first substrate bias control voltage and the second substrate bias control voltage, respectively, and is adapted to provide a measure of performance to the substrate bias control circuit. The substrate bias control circuit is adapted to optimize the current consumption of the circuit by continuously altering the levels of the first substrate bias control voltage and the second substrate bias control voltage based on the performance measurement.

16 Claims, 4 Drawing Sheets

DYNAMIC BACK-BIASING IN FD-SOI PROCESS FOR OPTIMIZING PSU RATIO

RELATED APPLICATION DATA

This application claims priority to, and the benefit of, European Patent Application No. 15202902.1 filed Dec. 29, 2015, pending. The entire disclosure of the above application is expressly incorporated by reference herein.

FIELD

This disclosure relates to hearing devices. More specifically, it relates to hearing devices comprising switched capacitor regulated power supplies.

BACKGROUND

Switched-capacitor power supplies are commonly used in hearing aids and headsets, where efficiency and small sizes are important design parameters. The efficiency of a switched capacitor power supply has a maximum value when operating at a fixed input to output ratio. Traditionally, the way to optimize the efficiency is to design the circuitry supplied from the power supply to work at the input voltage times a fixed ratio, e.g. 2:1. In a hearing instrument, the input voltage is highly varying as it is a function of the battery voltage and the current being drawn from the battery. Supplying a fixed voltage from the switched-capacitor power supply at all times is therefore not optimal.

SUMMARY

The threshold voltage $V_t$ for an NMOS transistor, also denoted the body effect, may be expressed as:

$$V_t = V_{t0} + \gamma(\sqrt{|2\varphi_f + V_{SB}|} - \sqrt{|2\varphi_f|}) \tag{1}$$

where $V_{t0}$ is the threshold voltage at 0 volts, $V_{SB}$ is the source-to-bulk terminal voltage, $\varphi_f$ is the Fermi potential, and $\gamma$ is the bulk threshold voltage potential. By varying the bulk biasing voltage, the threshold voltage $V_t$ may be altered. When $V_t$ changes, the capacitance of the NMOS transistor also changes. A similar expression exists for $V_t$ of a PMOS transistor.

The propagation delay of a CMOS gate is a function of power supply voltage $V_{DD}$ and $V_t$ of the transistors, and may be expressed by:

$$T_d = \frac{KC_L V_{DD}}{(V_{DD} - V_{th})^\alpha} \tag{2}$$

where K is a proportional constant, $C_L$ is the load capacitance, and α is the velocity saturation. The total power consumption of an integrated CMOS circuit is the sum of dynamic power, static leakage current, and short circuit power. The short circuit power occurs during signal transitions and is usually negligible if the circuit is carefully designed. The total power may thus be described as:

$$P_{tot} = C_{eff} V^2 f + P_{leak}, \text{ where } P_{leak} = P_{gate} + P_{subthr} + P_{BTBT} \tag{3}$$

where $P_{gate}$ is ignored (negligible), $P_{subthr}$ is the subthreshold power, and $P_{BTBT}$ is the Band-to-Band-Tunneling power. Dependent on technology, a considerable amount of power may be saved if the circuit is adapted for operation at a specific supply voltage of a predetermined range of supply voltages. In e.g. a hearing aid, the battery voltage may vary considerably over time, If the current consumption also changes, e.g. if an on-board radio circuit consuming a lot of power is employed intermittently, the adaptability of the circuit will beneficially prolong battery life.

The voltage potential on the substrate of an integrated CMOS circuit may be denoted the back-biasing voltage, the bulk biasing voltage, or the body biasing voltage. Throughout this text these terms are used interchangeably. An adaptive back-bias voltage generator is disclosed in the article "*An Adaptive Body-Bias Generator for Low Voltage CMOS VLSI Circuits*", *International Journal of Distributed Sensor Networks*, 4: p. 213-222, 2008. This back-bias voltage generator is capable of adaptively providing voltages in the range between −0.4 V and 0.3 V in 0.1 V increments. However, it may be desirable to have an adaptive back-bias voltage generator capable of providing continuously varying back-biasing voltages controlled by a measurement of current consumption.

According to a first aspect, a power control circuit for a hearing device is disclosed, said power control circuit comprising a switched-capacitor power supply, a substrate bias control circuit, a desired performance reference circuit, a performance monitor circuit, a first plurality of N-type semiconductors and a second plurality of P-type semiconductors, the switched-capacitor power supply being adapted to provide a supply voltage for the hearing device, the substrate bias control circuit being adapted to provide a first substrate bias control voltage to the bulk terminals of said first plurality of semiconductors and a second substrate bias control voltage to the bulk terminals of said second plurality of semiconductors, wherein the performance monitor circuit is adapted to monitor the supply voltage, the first substrate bias control voltage and the second substrate bias control voltage, respectively, and provide a measure of performance to a first input of the substrate bias control circuit, the desired performance reference circuit providing a performance reference to a second input of the substrate bias control circuit, and the substrate bias control circuit is adapted to optimize the power consumption by continuously altering the levels of the first substrate bias control voltage and the second substrate bias control voltage, respectively. The voltage ratio of the switched-capacitor power supply being constant, the semiconductor current leaks in the circuit may be minimized by making the operating conditions of the semiconductors in the hearing device circuit adapt to the available operating voltage, thus optimizing the power consumption when the battery voltage or the current consumption varies.

In an embodiment, the performance monitor of the power control circuit is a ring oscillator, and the substrate bias control circuit is a phase locked loop. The ring oscillator operates at a frequency given by the average propagation delay in the semiconductors. When the supply voltage rises, the propagation delay decreases, making the ring oscillator frequency rise. The substrate bias control circuit converts the rising frequency to a larger P-bulk biasing voltage and a smaller N-bulk biasing voltage, respectively. This increases the propagation delay of the semiconductors in the circuit, including the ring oscillator, making its frequency fall. Thus, a self-regulating loop is established.

In an alternative embodiment, the performance monitor of the power control circuit is a set of current monitors, and the substrate bias control circuit is a set of operational amplifiers. A constant current through a generic on-chip P-transistor provided with a fixed voltage applied between the gate and drain is used to provide a P-bulk biasing voltage via an operational amplifier. The P-bulk biasing voltage is also provided to the bulk terminal of the generic P-transistor which forms a closed loop regulating the operational conditions of the P-transistor by altering the P-bulk biasing voltage. Similarly, a constant current through a generic on-chip N-transistor provided with a fixed voltage applied between the gate and source is used to provide an N-bulk biasing voltage via another operational amplifier. The N-bulk biasing voltage is also provided to the bulk terminal of the generic N-transistor which forms another closed loop regulating the operational conditions of the N-transistor by altering the N-bulk biasing voltage.

In an embodiment, the levels of the first substrate bias control voltage and the second substrate bias control voltage, respectively, are regulated synchronously. This ensures that the operational symmetry is maintained throughout the circuit.

Further features and embodiments are apparent from the claims.

A power control circuit for a hearing device, includes: a switched-capacitor power supply configured to provide a supply voltage for the hearing device; a substrate bias control circuit; a reference circuit; a performance monitor circuit; a first plurality of semiconductors; and a second plurality of semiconductors; wherein the substrate bias control circuit is configured to provide a first substrate bias control voltage to terminals of the first plurality of semiconductors and a second substrate bias control voltage to terminals of the second plurality of semiconductors; wherein the performance monitor circuit is configured to monitor the supply voltage, the first substrate bias control voltage, and the second substrate bias control voltage, and to provide a measure of performance to a first input of the substrate bias control circuit; wherein the reference circuit is configured to provide a performance reference to a second input of the substrate bias control circuit; and wherein the substrate bias control circuit is configured to alter a level of the first substrate bias control voltage and a level of the second substrate bias control voltage.

Optionally, the reference circuit comprises an oscillator having a fixed frequency.

Optionally, the performance monitor circuit comprises a ring oscillator, and the substrate bias control circuit comprises a phase locked loop.

Optionally, the performance monitor circuit comprises a set of current monitors, and the substrate bias control circuit comprises a set of operational amplifiers.

Optionally, the substrate bias control circuit is configured to regulate the level of the first substrate bias control voltage and the level of the second substrate bias control voltage synchronously.

Optionally, the hearing device comprises a headset.

Optionally, the hearing device comprises a hearing aid.

Optionally, the first plurality of semiconductors comprises N-type semiconductors.

Optionally, the second plurality of semiconductors comprises P-type semiconductors.

Optionally, the substrate bias control circuit is configured to alter the level of the first substrate bias control voltage and the level of the second substrate bias control voltage to adjust a power consumption.

Optionally, the substrate bias control circuit is configured to alter the level of the first substrate bias control voltage and the level of the second substrate bias control voltage to control the supply voltage of the switched-capacitor power supply.

A method of operating a power circuit for a hearing device, the power circuit comprising a switched-capacitor power supply, a substrate bias control circuit, a reference circuit, a performance monitor circuit, a first plurality of semiconductors, and a second plurality of semiconductors, the switched-capacitor power supply being configured to provide a supply voltage for the hearing device, the substrate bias control circuit being configured to provide a first substrate bias control voltage to terminals of the first plurality of semiconductors and a second substrate bias control voltage to the terminals of the second plurality of semiconductors, wherein the performance monitor is configured to monitor the supply voltage, the first substrate bias control voltage, and the second substrate bias control voltage, the method includes: providing a measure of performance to a first input of the substrate bias control circuit; providing a performance reference to a second input of the substrate bias control circuit using the reference circuit; and altering a level of the first substrate bias control voltage and a level of the second substrate bias control voltage using the substrate bias control circuit.

Optionally, the level of the first substrate bias control voltage and the level of the second substrate bias control voltage are altered to adjust a power consumption.

Optionally, the level of the first substrate bias control voltage and the level of the second substrate bias control voltage are altered to control the supply voltage of the switched-capacitor power supply.

Other aspects and advantageous will be described in the detailed description.

DESCRIPTION OF THE FIGURES

The power control circuit is now described in greater details with reference to the drawings, where.

DETAILED DESCRIPTION

Figure 1:
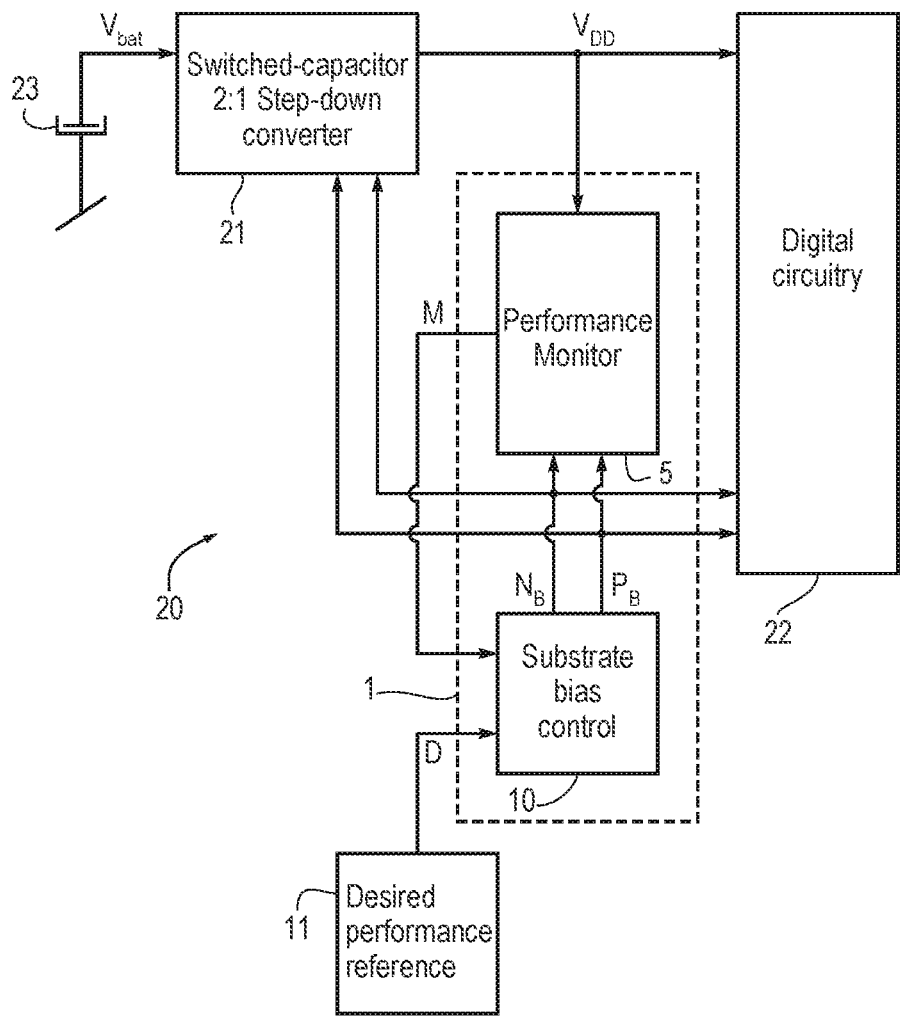
FIG. 1 is a block schematic illustrating a power control circuit, a performance monitor and a substrate bias voltage control.

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

FIG. 1 is a block schematic illustrating a power control circuit 1, a performance monitor 5 and a substrate bias voltage control 10 of a hearing device circuit 20. A battery 23 provides the voltage $V_{bat}$ to an input terminal of a switched-capacitor 2:1 step-down voltage converter 21, which, in turn, provides an output voltage $V_{DD}$ as a power voltage to a digital circuitry 22. The output voltage $V_{DD}$ is also fed to a first input of the performance monitor 5. The substrate bias voltage control 10 provides a P-bulk biasing voltage $P_B$ and an N-bulk biasing voltage $N_B$ to the semiconductors (not shown) of the digital circuitry 22 and to the performance monitor circuit 5. The bulk biasing voltages $P_N$ and $P_B$ are also fed (not shown) to the step-down voltage converter 21. A measured performance signal is provided by the performance monitor 5 as a first input signal to the substrate bias control circuit 10. A desired performance reference circuit 11 provides a reference signal as a second input signal to the substrate bias control circuit 10. The performance monitor 5 and the substrate bias control 10 constitute the power control circuit 1.

During operation, the step-down voltage converter 21 provides the output voltage $V_{DD}$ from the voltage $V_{bat}$ of the battery 23 to the digital circuitry 22. The voltage output voltage $V_{DD}$ is monitored by the performance monitor 5. The performance monitor 5 is adapted to provide a measured performance signal M of a value forcing the substrate bias voltage control circuit 10 to provide nominal substrate bias voltages $P_B$ and $N_B$ to the digital circuitry 22.

If, for some reason, the battery voltage $V_{bat}$ drops below the nominal voltage, the output voltage $V_{DD}$ also drops due to the fixed step-down conversion rate of the step-down voltage converter 21, and the measured performance signal M will drop correspondingly. The substrate bias voltage control circuit 10 continuously compares the measured performance signal to the reference signal from the desired performance reference circuit 11, and when the measured signal M drops, as stated in the foregoing, the substrate bias control circuit 10 will decrease the P-substrate bias voltage $P_B$ and increase the N-substrate bias voltage $N_B$ correspondingly. When the P-substrate bias voltage is decreased and the N-substrate bias voltage is increased, the threshold voltage $V_{th}$ of the P-transistors and the N-transistors in the digital circuitry 22, the performance monitor 5 and the step-down voltage converter 21 also decreases. When the threshold voltage $V_{th}$ decreases, the capacitance of the semiconductor elements will also decrease. This causes the average propagation delay $\tau_d$ to decrease, which in turn increases the switching frequency of the whole circuit in order to compensate for the decrease in $V_{DD}$.

If the battery voltage $V_{bat}$ should rise above the nominal voltage, the output voltage $V_{DD}$ also rises, and the measured performance signal M will rise correspondingly. This causes the substrate bias control circuit 10 to increase the P-substrate bias voltage $P_B$ and decrease the N-substrate bias voltage $N_B$ correspondingly. When the P-substrate bias voltage is increased and the N-substrate bias voltage is decreased, the threshold voltage $V_{th}$ of the P-transistors and the N-transistors in the digital circuitry 22, the performance monitor 5 and the step-down voltage converter 21 increases. When the threshold voltage $V_{th}$ increases, the capacitance of the semiconductor elements will also increase. This causes the average propagation delay $\tau_d$ to increase, which in turn decreases the switching frequency of the whole circuit in order to compensate for the increase in $V_{DD}$.

Figure 2:
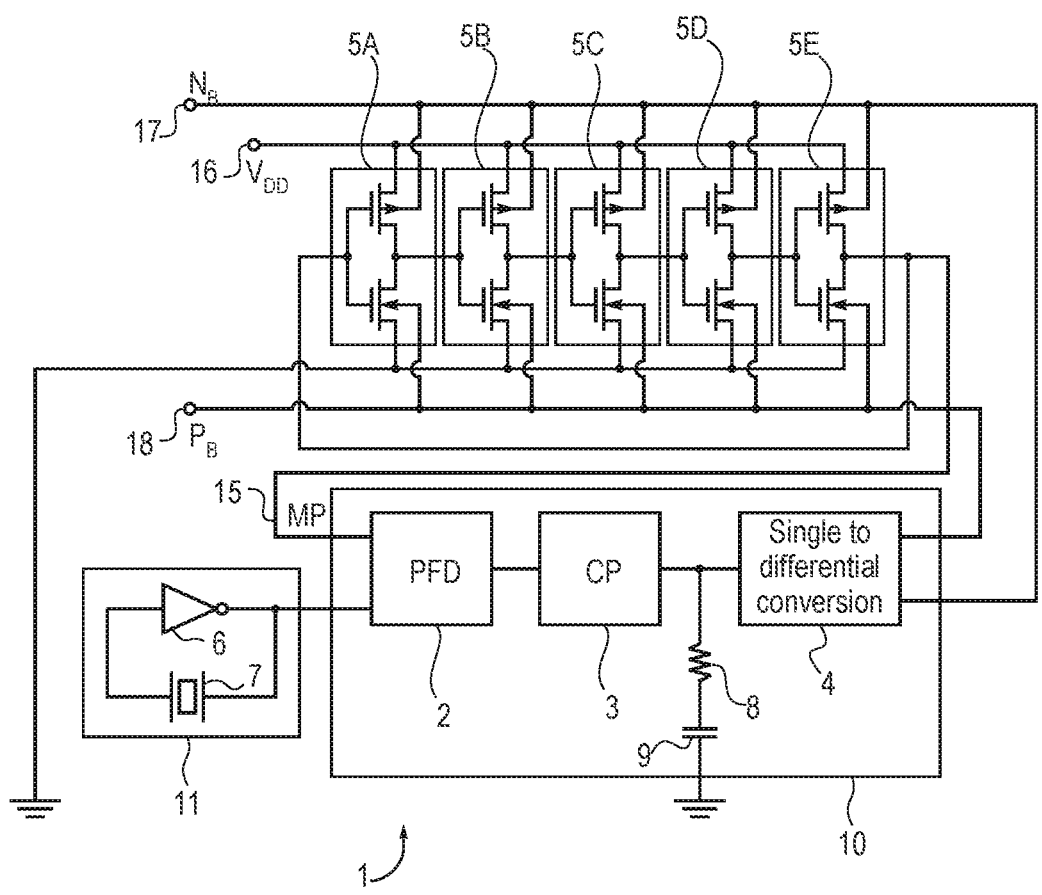
FIG. 2 is block schematic illustrating an embodiment of a performance monitor of the power control circuit shown in FIG. 1.

FIG. 2 is a schematic illustration of an exemplary power control circuit 1 as shown in FIG. 1. The power control circuit 1 comprises a substrate bias voltage control circuit 10, a desired performance reference circuit 11 and five CMOS inverters 5A, 5B, 5C, 5D, 5E configured as a ring oscillator. The ring oscillator is used for monitoring circuit performance in a manner discussed in greater detail in the following. The substrate bias voltage control circuit 10 comprises a phase frequency detector circuit 2, a charge pump circuit 3, and a low pass filter circuit comprising a first resistor 8 and a capacitor 9, and a single-to-differential voltage converter circuit 4. The desired performance reference circuit 11 comprises a CMOS inverter 6 and a reference crystal 7, and the signal from the desired performance reference circuit 11 is fed as an input signal to a first input of the phase frequency detector 2 of the substrate bias voltage control circuit 10. Each of the CMOS inverters 5A, 5B, 5C, 5D and 5E comprises a PMOS transistor and an NMOS transistor coupled as an inverter circuit. All the PMOS transistors of the inverters have their drain terminals coupled to ground and their bulk terminals coupled to a P-bulk terminal $P_B$, whereas all the NMOS transistors of the inverters have their source terminals coupled to $V_{DD}$, their drain terminals coupled to the source terminals of the respective PMOS transistor and their bulk terminals coupled to an N-bulk terminal $P_N$. The output of the fifth CMOS inverter 5E is coupled to the input of the first inverter 5A. When power is applied to the ring oscillator it will spontaneously start to oscillate at a frequency $f_o$ determined by:

$$f_o = \frac{1}{2m\tau_d} \quad (4)$$

where $\tau_d$ is the propagation delay of a single CMOS inverter and m is the number of inverters in the ring oscillator. The frequency of a ring oscillator is typically many times the frequency of the crystal oscillator used as a reference or as a clock signal. The output signal of the ring oscillator is fed as a monitor performance signal to a second input of the phase frequency detector 2 of the substrate bias voltage control circuit 10. The phase frequency detector 2 provides a series of positive pulses when the monitor performance signal is leading in relation to the desired performance reference signal and a set of negative pulses when the monitor performance signal is lagging in relation to the desired performance reference signal. The output signal from the phase frequency detector 2 is used as input to the charge pump circuit 3. The charge pump 3 provides a set of pulses at a desired voltage level. The output from the charge pump circuit 3 is used as an input to the single-to-differential converter circuit 4 after being smoothed by the low-pass filter comprised by the first resistor 8 and the first capacitor 9, yielding a slowly varying DC voltage. In the single-to-differential converter circuit 4, the input signal is used to generate a P-bulk voltage level and an N-bulk voltage level for the P-bulk terminals and the N-bulk terminals, respectively, of the semiconductors in the circuit.

When the power control circuit 1 is operating, the ring oscillator operates at the frequency $f_o$. If the supply voltage $V_{DD}$ drops, the frequency $f_o$ falls. This causes the input signal from the ring oscillator to the phase frequency detector 2 to lag relative to the output from the desired performance reference circuit 11, resulting in the output voltage from the charge pump circuit 3 dropping correspondingly as stated in the foregoing. A drop in the input voltage to the single-to-differential converter circuit 4 results in the P-bulk biasing voltage dropping and the N-bulk biasing voltage rising, thus causing the average propagation delay $\tau_d$ of the circuit to decrease, making the ring oscillator frequency rise in accordance with eq. (4). If the supply voltage $V_{DD}$ rises, the frequency $f_o$ also rises. This causes the input signal from the ring oscillator to the phase frequency detector 2 to lead relative to the output from the desired performance reference circuit 11, causing in the output voltage from the charge pump circuit 3 to rise correspondingly. A rise in the input voltage to the single-to-differential converter circuit 4 results in the P-bulk biasing voltage rising and the N-bulk biasing voltage dropping, thus causing the average propagation delay $\tau_d$ of the circuit to increase, making the ring oscillator frequency fall. In this way, a self-regulating loop capable of controlling the P-biasing and the N-biasing voltages, respectively, is effectively established, and the hearing device circuit may thus operate safely within a relatively wide range of $V_{DD}$ voltage levels without experiencing excessive current leaks.

Figure 3:
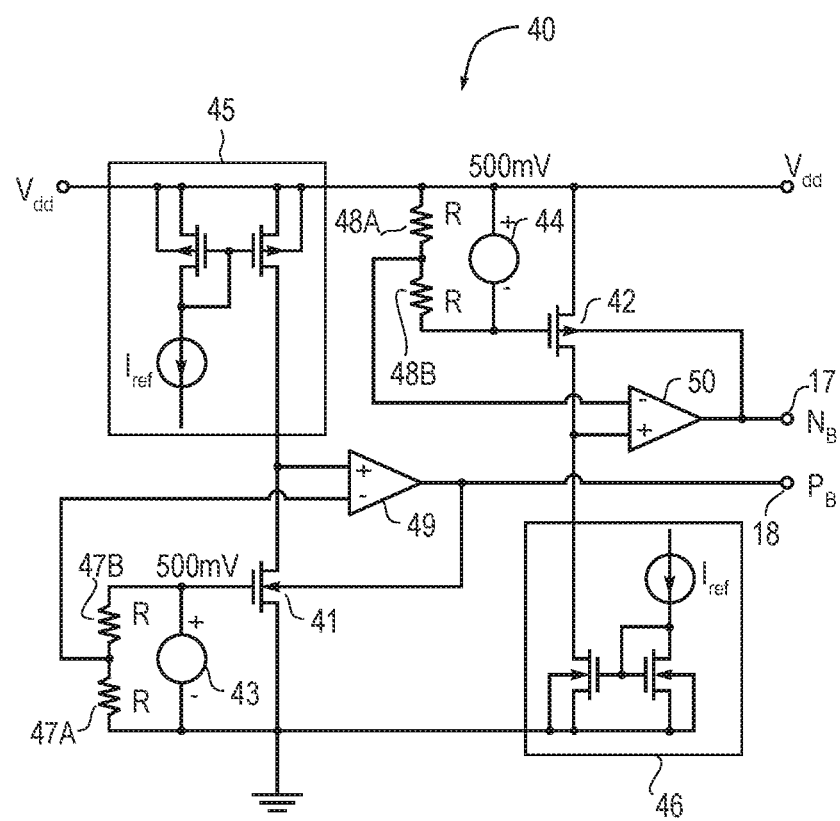
FIG. 3 is an block schematic illustrating alternative embodiment of a performance monitor of the power control circuit shown in FIG. 1.

FIG. 3 is a schematic illustration of an alternative substrate bias voltage control circuit 40. The circuit comprises a generic P-type MOS transistor 41, a generic N-type MOS transistor 42, a first reference voltage generator 43, a second reference voltage generator 44, a first reference current generator 45, a second reference voltage generator 46, a first voltage divider network comprising second resistor 47A and third resistor 47B, a second voltage divider network comprising fourth resistor 48A and fifth resistor 48B, a first operational amplifier 49 and a second operational amplifier 50. The alternative substrate bias voltage control circuit 40 may be used in place of the substrate voltage control circuit 10 shown in FIG. 1. In the alternative substrate bias voltage control circuit 40 the performance is monitored by constantly measuring $I_{on}$ of the PMOS transistor 41 and the NMOS transistor 42, respectively. If $V_{DD}$ drops, $I_{on}$ will decrease for the PMOS transistor 41 and cause the voltage potential on the positive terminal of the first operational amplifier 49 to decrease. This, in turn, will reduce the output voltage of the first operational amplifier 49 and thus decrease the bulk bias voltage on the bulk terminal of the PMOS transistor 41. Similarly, $I_{on}$ will decrease for the NMOS transistor 42 and cause the voltage potential on the positive terminal of the second operational amplifier 50 to increase, which, in turn, will increase the output voltage of the second operational amplifier 50 and thus increase the bulk bias voltage on the bulk terminal of the NMOS transistor 42. If VDD rises, the bulk biasing voltage on the bulk terminal of the PMOS transistor 41 will decrease and the bulk biasing voltage on the bulk terminal of the NMOS transistor 42 will increase. In other words, the operation of the alternative substrate bias voltage control circuit 40 is similar to the operation of the substrate bias voltage control circuit 10 shown in FIG. 2.

Figure 4:
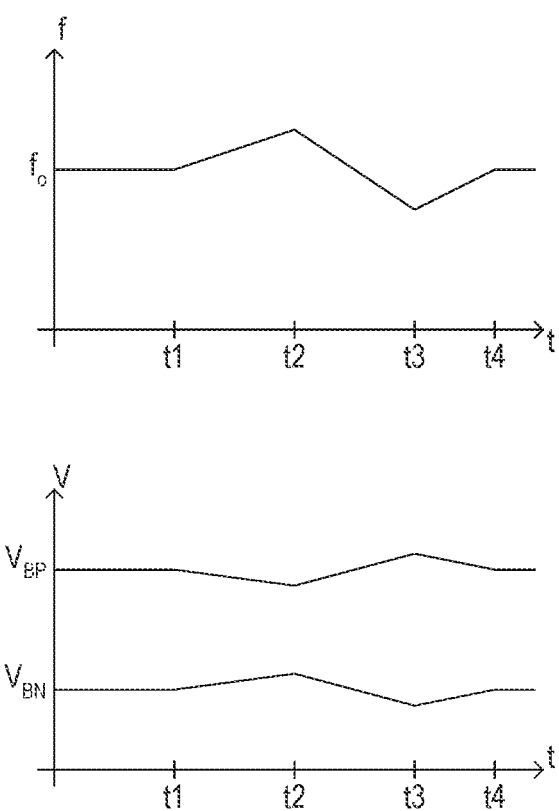
FIG. 4 is a timing diagram illustrating the regulation loop of the power control circuit shown in FIG. 1.

FIG. 4 is a timing diagram illustrating the operation of the substrate bias voltage control circuit shown in FIG. 1. The timing diagram has an upper graph showing the frequency $f_o$ of the ring oscillator shown in FIG. 2 over time, and a lower graph showing corresponding P-bulk and N-bulk biasing voltages $V_{BP}$ and $V_{BN}$ of the hearing device circuit, respectively.

On the upper graph of FIG. 4, the ring oscillator frequency $f_o$ is constant from the abscissa to the point t1. Likewise, the P-bulk voltage $V_{BP}$ and the N-bulk voltage $V_{BN}$ in the lower graph are both constant from the abscissa to the point t1. From the point t1 to the point t2, the ring oscillator frequency $f_o$ is increasing. Correspondingly in the lower graph, the P-bulk voltage $V_{BP}$ is decreasing and the N-bulk voltage $V_{BN}$ is increasing. From the point t2 to the point t3, the ring oscillator frequency $f_o$ is decreasing, and the P-bulk voltage $V_{BP}$ is increasing and the N-bulk voltage $V_{BN}$ is decreasing. From the point t3 to the point t4, the ring oscillator frequency $f_o$ is increasing, and the P-bulk voltage $V_{BP}$ is decreasing and the N-bulk voltage $V_{BN}$ is increasing. From the point t4 onwards, $f_o$ is constant and thus $V_{BP}$ and $V_{BN}$ are also constant. It is thus evident that an efficient, self-regulating loop system for continuously controlling CMOS bulk biasing voltages of electronic circuits may be attained. This may be particularly beneficial in realizing the circuit in Fully Depleted Silicon-On-Insulator semiconductor technologies.

Although particular features have been shown and described, it will be understood that they are not intended to limit the claimed invention, and it will be made obvious to those skilled in the art that various changes and modifications may be made without departing from the scope of the claimed invention. The specification and drawings are, accordingly to be regarded in an illustrative rather than restrictive sense. The claimed invention is intended to cover all alternatives, modifications and equivalents.

REFERENCE NUMBERS 1 power control circuit
2 phase frequency detector circuit
3 charge pump circuit
4 single-ended to differential conversion circuit
5 performance monitor circuit
5A first inverter of performance monitor
5B second inverter of performance monitor
5C third inverter of performance monitor
5D fourth inverter of performance monitor
5E fifth inverter of performance monitor
6 inverter of reference
7 crystal of reference
8 resistor of LP filter
9 capacitor of LP filter
10 substrate bias control circuit
11 desired performance reference circuit
15 measured performance line
16 supply voltage
17 N-bulk biasing voltage line
18 P-bulk biasing voltage line
20 bulk biasing supply circuit
21 switched-capacitor 2:1 step-down voltage converter
22 digital circuitry
23 battery
40 alternative power control circuit
41 generic P-type transistor
42 generic N-type transistor
43 first voltage reference
44 second voltage reference
45 first current generator
46 second current generator
47A first resistor
47B second resistor
48A third resistor
48B fourth resistor
49 first operational amplifier
50 second operational amplifier

The invention claimed is:
1. A power control circuit for a hearing device, the power control circuit comprising:
 a switched-capacitor power supply configured to provide a supply voltage for the hearing device;
 a substrate bias control circuit;
 a reference circuit;
 a performance monitor circuit;
 a first plurality of semiconductors; and
 a second plurality of semiconductors;
 wherein the substrate bias control circuit is configured to provide a first substrate bias control voltage to terminals of the first plurality of the semiconductors and a second substrate bias control voltage to terminals of the second plurality of semiconductors;

wherein the performance monitor circuit is configured to monitor the supply voltage, the first substrate bias control voltage, and the second substrate bias control voltage, and to provide a measure of performance to a first input of the substrate bias control circuit;

wherein the reference circuit is configured to provide a performance reference to a second input of the substrate bias control circuit; and wherein the substrate bias control circuit is configured to alter a level of the first substrate bias control voltage and a level of the second substrate bias control voltage.

2. The power control circuit according to claim 1, wherein the reference circuit comprises an oscillator having a fixed frequency.

3. The power control circuit according to claim 1, wherein the performance monitor circuit comprises a ring oscillator, and the substrate bias control circuit comprises a phase locked loop.

4. The power control circuit according to claim 1, wherein the performance monitor circuit comprises a set of current monitors, and the substrate bias control circuit comprises a set of operational amplifiers.

5. The power control circuit according to claim 1, wherein the substrate bias control circuit is configured to regulate the level of the first substrate bias control voltage and the level of the second substrate bias control voltage synchronously.

6. The power control circuit according to claim 1, wherein the hearing device comprises a headset.

7. The power control circuit according to claim 1, wherein the hearing device comprises a hearing aid.

8. The power control circuit according to claim 1, wherein the first plurality of semiconductors comprises N-type semiconductors.

9. The power control circuit according to claim 1, wherein the second plurality of semiconductors comprises P-type semiconductors.

10. The power control circuit according to claim 1, wherein the substrate bias control circuit is configured to alter the level of the first substrate bias control voltage and the level of the second substrate bias control voltage to adjust a power consumption.

11. The method of claim 10, wherein the level of the first substrate bias control voltage and the level of the second substrate bias control voltage are altered to adjust a power consumption.

12. The method of claim 10, wherein the level of the first substrate bias control voltage and the level of the second substrate bias control voltage are altered to control the supply voltage of the switched-capacitor power supply.

13. The method of claim 10, wherein the level of the first substrate bias control voltage and the level of the second substrate bias control voltage are altered in response to variations in the supply voltage.

14. The power control circuit according to claim 1, wherein the substrate bias control circuit is configured to alter the level of the first substrate bias control voltage and the level of the second substrate bias control voltage to control the supply voltage of the switched-capacitor power supply.

15. The power control circuit according to claim 1, wherein the substrate bias control circuit is configured to alter the level of the first substrate bias control voltage and the level of the second substrate bias control voltage in response to variations in the supply voltage.

16. A method of operating a power circuit for a hearing device, the power circuit comprising a switched-capacitor power supply, a substrate bias control circuit, a reference circuit, a performance monitor circuit, a first plurality of semiconductors, and a second plurality of semiconductors, the switched-capacitor power supply being configured to provide a supply voltage for the hearing device, the substrate bias control circuit being configured to provide a first substrate bias control voltage to terminals of the first plurality of semiconductors and a second substrate bias control voltage to the terminals of the second plurality of semiconductors, wherein the performance monitor circuit is configured to monitor the supply voltage, the first substrate bias control voltage, and the second substrate bias control voltage, the method comprising:

providing a measure of performance to a first input of the substrate bias control circuit;

providing a performance reference to a second input of the substrate bias control circuit using the reference circuit; and altering a level of the first substrate bias control voltage and a level of the second substrate bias control voltage using the substrate bias control circuit.

\* \* \* \* \*